US012789387B2

(12) United States Patent
Matsumoto

(10) Patent No.: US 12,789,387 B2
(45) Date of Patent: Nov. 10, 2026

(54) SUBSTRATE PROCESSING APPARATUS, SUBSTRATE SHAPE SPECIFYING METHOD, TRANSFER DEVICE, AND END EFFECTOR

(71) Applicant: TOKYO ELECTRON LIMITED, Tokyo (JP)

(72) Inventor: Wataru Matsumoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 202 days.

(21) Appl. No.: 18/457,053

(22) Filed: Aug. 28, 2023

(65) Prior Publication Data

US 2024/0075633 A1 Mar. 7, 2024

(30) Foreign Application Priority Data

Sep. 2, 2022 (JP) ................................ 2022-140305

(51) Int. Cl.

| | |
|---|---|
| ***H10P 72/76*** | (2026.01) |
| ***B25J 9/16*** | (2006.01) |
| ***B25J 11/00*** | (2006.01) |
| ***B25J 13/08*** | (2006.01) |
| ***B25J 15/06*** | (2006.01) |

(52) U.S. Cl.

CPC ......... *B25J 11/0095* (2013.01); *B25J 9/1633* (2013.01); *B25J 13/087* (2013.01); *B25J 15/0616* (2013.01); *H10P 72/7602* (2026.01)

(58) Field of Classification Search

CPC ...... B25J 11/0095; B25J 9/1633; B25J 9/043; B25J 9/042; B25J 13/087; B25J 15/0616; H01L 21/67742; H01L 21/67766; H01L 21/6838; H01L 21/68707; H10P 72/3302; H10P 72/3402; H10P 72/78; H10P 72/7602

See application file for complete search history.

(56) References Cited

U.S. PATENT DOCUMENTS 8,720,873 B2 5/2014 Hayashi et al.
9,760,023 B2 9/2017 Toyomaki
(Continued)

FOREIGN PATENT DOCUMENTS

JP 2011-161521 A 8/2011
JP 2012-199282 A 10/2012
(Continued)

OTHER PUBLICATIONS

Oxford English Dictionary, "inclination NOUN", https://www.oed.com/dictionary/inclination_n?tab=meaning_and_use#791696, accessed Feb. 5, 2026 (Year: 2016).*
(Continued)

*Primary Examiner* — Gerald McClain
(74) *Attorney, Agent, or Firm* — Fenwick & West LLP

(57) ABSTRACT

This substrate processing apparatus comprises a substrate placing portion on which a substrate is placed, one or more support portions configured to support the substrate and disposed at portions of the substrate placing portion that are brought into contact with the substrate, the one or more support portions being at least partially deformed by the contact with the substrate, a detector configured to detect deformation of the support portion; and a controller configured to specify a degree of the deformation of the substrate based on the detection result of the detector.

15 Claims, 13 Drawing Sheets

(56) References Cited

U.S. PATENT DOCUMENTS

| | | | | |
|---|---|---|---|---|
| 11,923,222 | B2 | 3/2024 | Kodama | |
| 12,269,694 | B2 * | 4/2025 | Doi | B65G 47/917 |
| 12,648,395 | B2 * | 6/2026 | Lin | H10P 72/0616 |
| 2010/0109360 | A1 * | 5/2010 | Meisho | B25J 17/0208 901/32 |
| 2011/0190927 | A1 | 8/2011 | Douki | |
| 2012/0235335 | A1 * | 9/2012 | Hayashi | H10P 72/78 269/21 |
| 2015/0146187 | A1 | 5/2015 | Toyomaki | |
| 2020/0346792 | A1 * | 11/2020 | Curhan | B25J 15/10 |
| 2021/0366747 | A1 * | 11/2021 | Kodama | B25J 9/1679 |
| 2022/0212884 | A1 * | 7/2022 | Doi | B25J 9/1612 |
| 2022/0219334 | A1 * | 7/2022 | Doi | B25J 19/02 |
| 2022/0333922 | A1 * | 10/2022 | Doi | B25J 19/06 |
| 2023/0019019 | A1 | 1/2023 | Kitano et al. | |
| 2024/0030057 | A1 * | 1/2024 | Son | H01L 21/67178 |
| 2024/0077298 | A1 * | 3/2024 | Matsumoto | G01B 7/16 |
| 2024/0139973 | A1 * | 5/2024 | Oka | B25J 15/10 |
| 2025/0171249 | A1 * | 5/2025 | Sato | B65G 47/905 |
| 2025/0183074 | A1 * | 6/2025 | Lin | H01L 21/68 |

FOREIGN PATENT DOCUMENTS

| | | | | |
|---|---|---|---|---|
| JP | 2013191601 | A | * | 9/2013 |
| JP | 2015-103696 | A | | 6/2015 |
| JP | 2021-114591 | A | | 8/2021 |
| KR | 10-2078309 | B1 | | 2/2020 |
| KR | 2078309 | B1 | * | 2/2020 |
| KR | 10-2021-0144580 | A | | 11/2021 |
| WO | 2020/230250 | A1 | | 11/2020 |
| WO | 2021/117620 | A1 | | 6/2021 |

OTHER PUBLICATIONS

Suzuki, Y. et al. "Strain Measurement Using Carbon-Nanotube Embedded Resin." The 25th Japan Institute of Electronics Packaging Spring Meeting, Mar. 2011, pp. 353-354.

Korean Intellectual Property Office, Office Action, Korean Patent Application No. 10-2023-0109542, Jan. 7, 2025, 21 pages.

* cited by examiner

SUBSTRATE PROCESSING APPARATUS, SUBSTRATE SHAPE SPECIFYING METHOD, TRANSFER DEVICE, AND END EFFECTOR

CROSS-REFERENCE TO RELATED APPLICATIONS

This application claims priority to Japanese Patent Application No. 2022-140305, filed on Sep. 2, 2022, the entire contents of which are incorporated herein by reference.

TECHNICAL FIELD

The present disclosure relates to a substrate processing apparatus, a substrate shape specifying method, a transfer device, and an end effector.

BACKGROUND

Japanese Laid-open Patent Publication No. 2015-103696 and No. 2012-199282 disclose transfer arms configured to stably hold and transfer a substrate even when deformation of the substrate, such as warpage or the like, has occurred.

SUMMARY

The present disclosure provides a technique for detecting deformation of a substrate.

In accordance with an aspect of the present disclosure, there is provided a substrate processing apparatus comprising: a substrate placing portion on which a substrate is placed; one or more support portions configured to support the substrate and disposed at portions of the substrate placing portion that are brought into contact with the substrate, said one or more support portions being at least partially deformed by the contact with the substrate; a detector configured to detect deformation of the support portion; and a controller configured to specify a degree of the deformation of the substrate based on the detection result of the detector.

DETAILED DESCRIPTION

Hereinafter, embodiments of a substrate processing apparatus, a substrate shape specifying method, a transfer device, and an end effector disclosed of the present disclosure will be described in detail with reference to the accompanying drawings. The following embodiments are not intended to limit the substrate processing apparatus, the substrate shape specifying method, the transfer device, and the end effector disclosed of the present disclosure.

In manufacturing semiconductor devices, various substate treatments such as film formation, etching, asking, and the like are performed on a substrate such as a semiconductor wafer or the like. The deformation of the substrate, such as warpage or the like, may occur due to various factors such as heat, film stress, and the like during substrate processing. Therefore, a transfer mechanism such as a transfer arm or the like, which is configured to stably hold and transfer the substrate even if the substrate is deformed, has been developed.

However, if the deformation is large enough to cause transfer errors, such as substrate breakage and the like, it is desired to stop a transfer operation and minimize damage. Even if the deformation is small so that the substrate can be transferred, it is desired to check a process that has caused the deformation. Therefore, a technique for detecting deformation of a substrate is expected.

First Embodiment

[Device Configuration]

Next, a first embodiment will be described. First, an example of a substrate processing apparatus will be described. The substrate processing apparatus transfers a substrate and performs substrate processing. Hereinafter, a case where the substrate processing apparatus performs film formation as the substrate processing will be described as an example.

Figure 1:
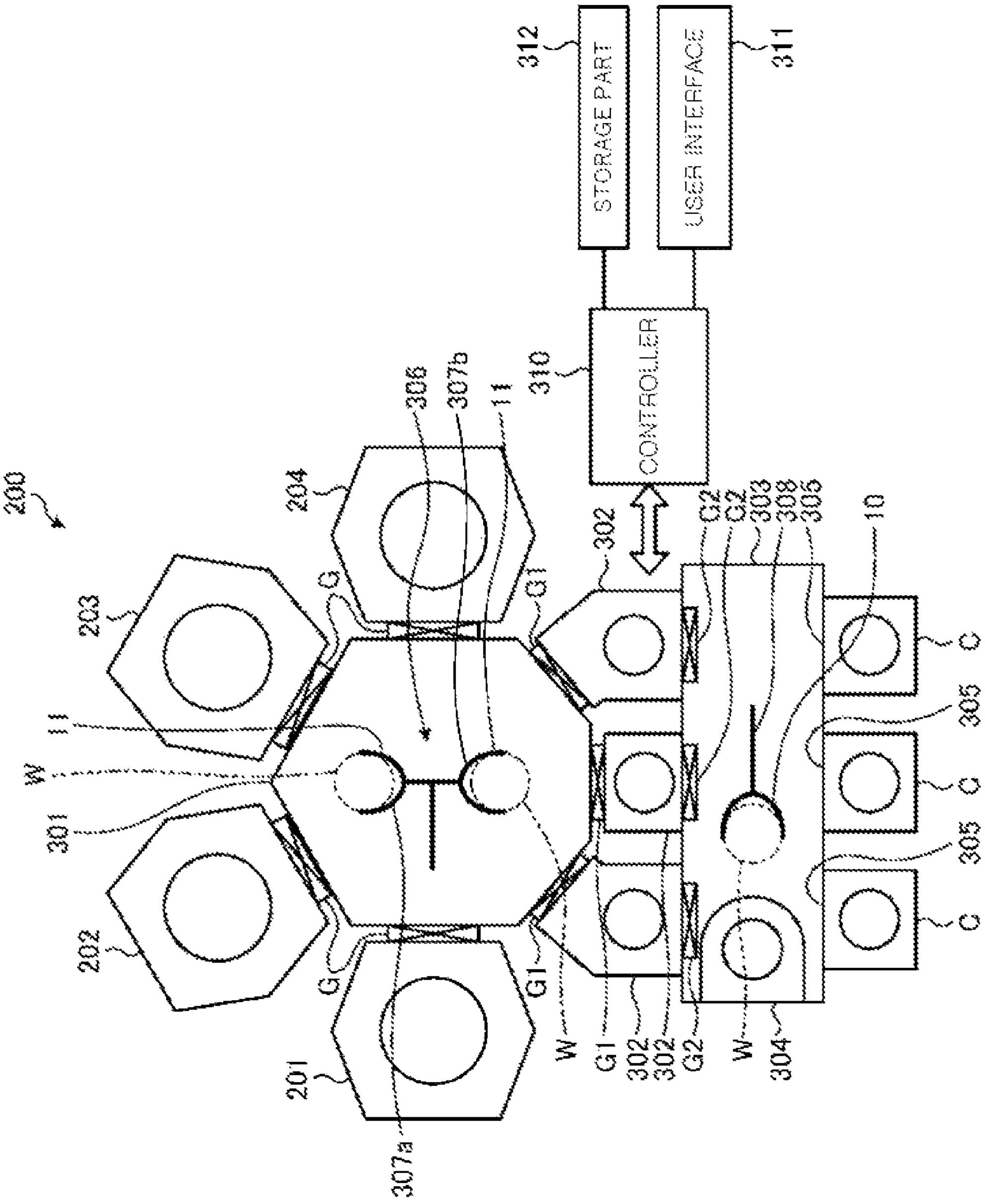
FIG. 1 is a schematic configuration diagram showing an example of a substrate processing apparatus according to a first embodiment.

FIG. 1 is a schematic configuration diagram showing an example of a substrate processing apparatus 200 according to the first embodiment. As shown in FIG. 1, the substrate processing apparatus 200 is a multi-chamber type apparatus having four chambers 201 to 204. In the substrate processing apparatus 200 according to the first embodiment, film formation is performed in each of the four chambers 201 to 204.

The chambers 201 to 204 are connected to four walls of a vacuum transfer chamber 301 having a heptagonal planar shape through gate valves G. The vacuum transfer chamber 301 is evacuated by a vacuum pump and maintained at a predetermined vacuum level. Three load-lock chambers 302 are connected to the other three walls of the vacuum transfer chamber 301 through gate valves G1. An atmospheric transfer chamber 303 is disposed on the opposite side of the vacuum transfer chamber 301 with the load-lock chamber 302 interposed therebetween. The three load-lock chambers 302 are connected to the atmospheric transfer chamber 303 through gate valves G2. The load-lock chambers 302 control a pressure between an atmospheric pressure and a vacuum state at the time of transferring a substrate W between the atmospheric transfer chamber 303 and the vacuum transfer chamber 301.

Three carrier mounting ports 305 on which carriers (FOUP or the like) C containing substrates W are disposed on a wall of the atmospheric transfer chamber 303 opposite to the wall to which the load-lock chambers 302 is attached. Further, an alignment chamber 304 for aligning the substrate W is disposed on the sidewall of the atmospheric transfer chamber 303. A downflow of clean air is formed in the atmospheric transfer chamber 303.

A transfer mechanism 306 is disposed in the vacuum transfer chamber 301. The transfer mechanism 306 is configured as an articulated arm. The transfer mechanism 306 has two transfer arms 307*a* and 307*b* capable of moving independently. The transfer mechanism 306 has an end effector 11 capable of supporting the substrate W on the tip ends of the transfer arms 307*a* and 307*b*. The substrate W is placed on the end effector 11. The transfer mechanism 306 transfers the substrate W to the chambers 201 to 204 and the load-lock chambers 302.

A transfer mechanism 308 is disposed in the atmosphere transfer chamber 303. The transfer mechanism 308 is configured as an articulated arm. The transfer mechanism 308 has an end effector 10 capable of supporting the substrate W on the tip end thereof. The transfer mechanism 308 is configured to transfer the substrate W to the carriers C, the load-lock chambers 302, and the alignment chamber 304.

The substrate processing apparatus 200 has a controller 310. The overall operation of the substrate processing apparatus 200 is controlled by the controller 310. A user interface 311 and a storage part 312 are connected to the controller 310.

The user interface 311 includes an operation part such as a keyboard for allowing a process manager to input commands in order to manage the substrate processing apparatus 200, and a display part such as a display for visualizing and displaying an operating status of the substrate processing apparatus 200. The user interface 311 receives various operations. For example, the user interface 311 receives a predetermined operation for instructing start or stop of substrate processing.

The storage part 312 stores programs (software) for realizing various processes executed in the substrate processing apparatus 200 under the control of the controller 310, data such as processing conditions, process parameters, and the like. The program or the data may be stored in a computer-readable computer recording medium (for example, a hard disk, CD, a flexible disk, a semiconductor memory, or the like). Alternatively, the program or the data may be transmitted from another device through a dedicated line, for example, and used online.

The controller 310 is, for example, a computer including a processor, a memory, and the like. The controller 310 reads the program or the data from the storage part 312 based on instructions from the user interface 311, and controls individual components of the substrate processing apparatus 200 to transfer the substrate W to the chambers 201 to 204 and perform substrate processing on the substrate W.

Figure 2:
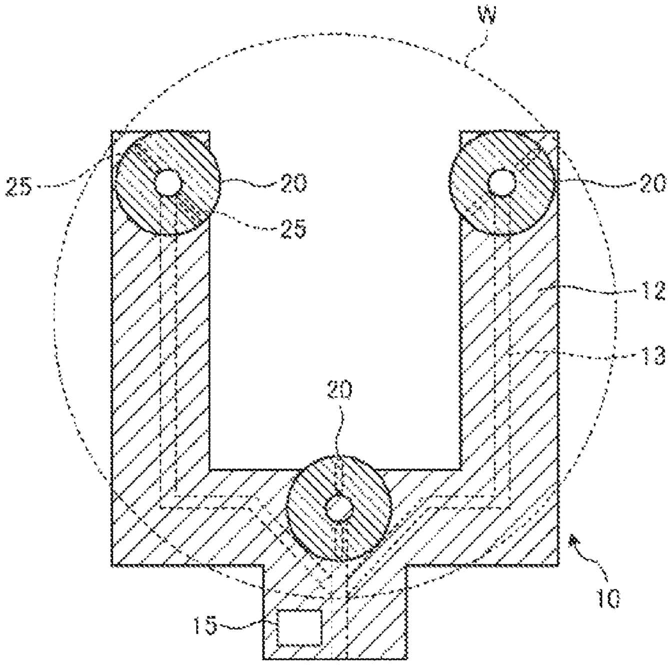
FIG. 2 is a schematic configuration diagram showing an example of a transfer mechanism according to the first embodiment.

Next, an example of a configuration of a transfer mechanism will be described. Hereinafter, a transfer mechanism 308 will be described as an example. FIG. 2 is a schematic configuration diagram showing an example of the transfer mechanism 308 according to the first embodiment. FIG. 2 shows a schematic configuration of the end effector 10 of the transfer mechanism 308.

The end effector 10 has a flat shape, and has an upper surface serving as a placing surface 12 on which the substrate W such as a semiconductor wafer or the like is placed. The end effector 10 transfers the substrate W while holding the substrate W on the placing surface 12 side. The end effector forms an arm disposed at the tip end of the transfer mechanism 308. The end effector 10 is made of ceramic. The end effector 10 has, at portions to be in contact with the substrate W, multiple support portions that are at least partially deformed by the contact with the substrate W and support the substrate W. The support portions are arranged in a circumferential direction of the substrate W. For example, the end effector 10 has a U-shaped tip end, and three pads 20 are disposed at two locations of the U-shaped tip end and one location of the bottom portion of the end effector 10. The substrate W is supported by the pads 20 by vacuum attraction. The transfer mechanism 308 has therein a suction passage 13 that reaches the pads 20. In FIG. 2, the suction passage 13 formed in the end effector 10 is indicated by dashed lines. In the first embodiment, the end effector 10 corresponds to the substrate placing portion of the present disclosure. Further, in the first embodiment, the pads 20 correspond to the support portions of the present disclosure.

Figure 3:
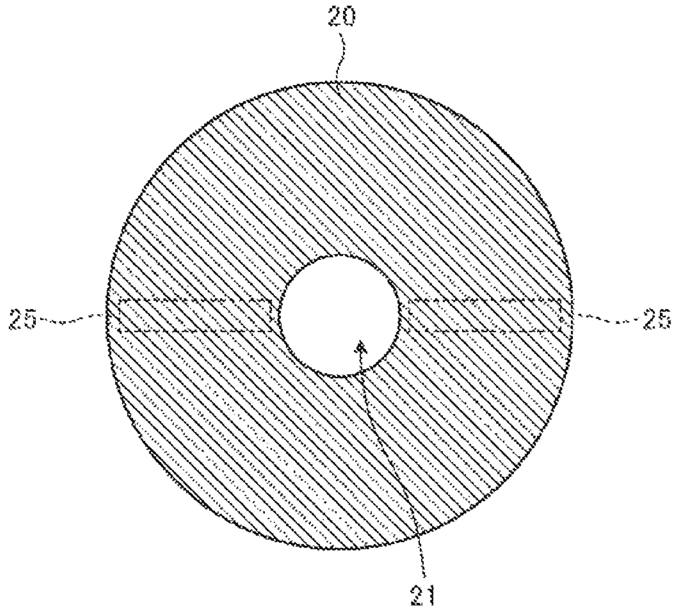
FIG. 3 is a plan view showing an example of a schematic configuration of a pad according to the first embodiment.

FIG. 3 is a plan view showing an example of a schematic configuration of the pad 20 according to the first embodiment. The pad 20 has an annular surface on the substrate W side. A suction port 21 is formed at the center of the pad 20.

The pad 20 is formed as an elastic resin pad to hold the substrate W while absorbing the warpage of the substrate W. The resin pad is preferably made of polyimide or polyetheretherketone (PEEK) that is elastic and has a high heat resistance temperature to hold a high-temperature substrate W. The resin pad may be made of a non-conductive material such as polyimide, or may be made of a conductive substance. If charges are accumulated in the pad, the devices on the substrate W may be damaged when the pads are brought into contact with the substrate W. Therefore, in the case where the charges are accumulated in the pads, the pads are preferably made of a conductive material.

The pad 20 is formed in a circular shape. The pad 20 is preferably formed in a perfect circular shape that allows the stress of the warped portion to be uniform, so that the pad 20 can transfer the substrate W while being warped. However, the pad 20 may have an oval shape, or may have a rectangular shape.

Figure 4:
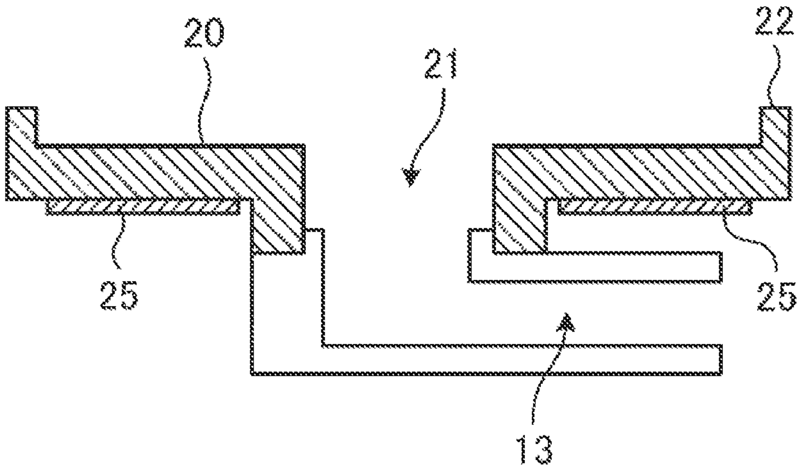
FIG. 4 is a cross-sectional view showing an example of a schematic configuration of a pad portion according to the first embodiment.

FIG. 4 is a cross-sectional view showing an example of a schematic configuration of the pad 20 according to the first embodiment. The suction port 21 of the pad 20 communicates with the suction passage 13. The pad 20 attracts the substrate W by conducting suction from the suction port 21.

The pad 20 has a protrusion 22 formed along the edge of the upper surface. The protrusion 22 has an annular shape along the edge of the pad 20. When the substrate W placed on the end effector 10 is sucked from the suction ports 21, the protrusion 22 is brought into close contact with the substrate W, and the space surrounded by the protrusion 22 between the substrate W and the pad 20 is depressurized. Accordingly, the pads 20 can strongly attract the substrate W.

The pad 20 is elastically deformed depending on the shape of the substrate W. The pad 20 is provided with deformation gauges 25 to detect deformation of the pad 20. For example, the deformation gauges 25 are attached to the bottom surface of the pad 20. In the first embodiment, the deformation gauges 25 are disposed at the inner side and the outer side, respectively, with the suction port 21 interposed therebetween. The deformation gauges 25 are disposed in a radial direction of the substrate W at the time of placing the substrate W on the end effector 10. The deformation gauges 25 are deformed by the deformation of the pad 20, and the resistance values thereof are changed by the expansion/contraction of a metal resistance material therein.

The deformation gauges 25 are connected to the detector through wiring (not shown). The detector 15 may be provided for each deformation gauge 25. The detector 15 detects the deformation of each deformation gauge 25 and outputs data indicating the deformation amount to the controller 310. For example, the detector 15 is provided with a bridge circuit, detects a change in the resistance value of the deformation gauge 25 as a voltage change using the bridge circuit, and outputs data of the detected voltage to the controller 310.

Figure 5:
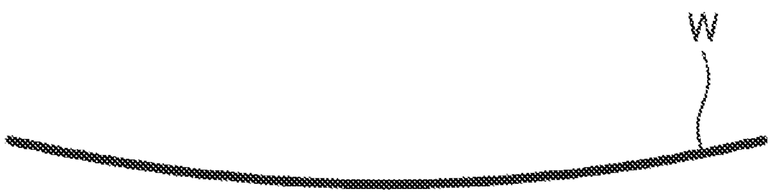
FIG. 5 shows an example of deformation of a substrate according to the first embodiment.

Here, the deformation of the substrate W, such as warpage or the like, may occur due to various factors. FIG. shows an example of deformation of the substrate W according to the first embodiment. FIG. 5 shows the shape of the substrate W viewed from a lateral direction. The substrate W is warped to protrude downward.

Figure 6:
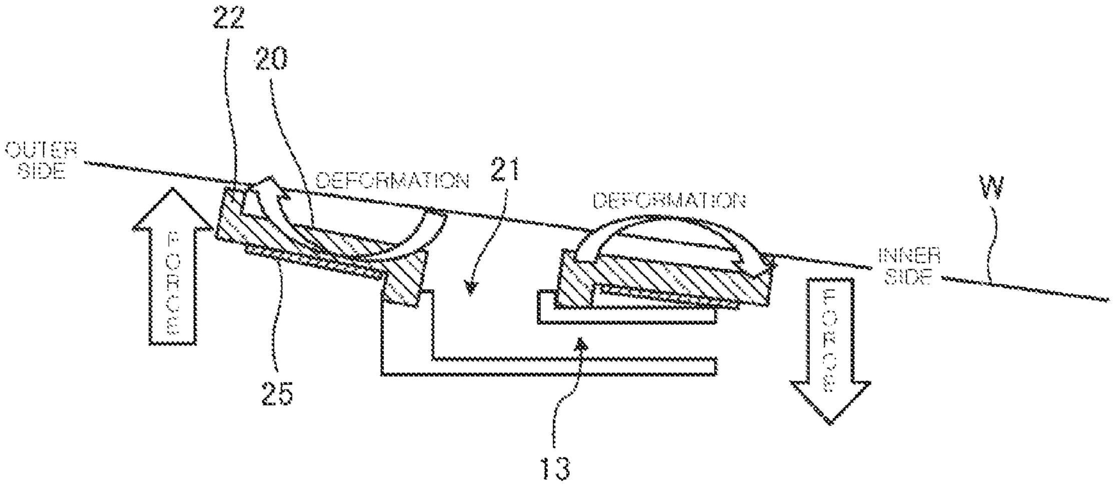
FIG. 6 shows an example of deformation of a pad according to the first embodiment.

The shape of the pad 20 changes depending on the shape of the substrate W to be supported. Therefore, the deformation of the deformation gauge 25 also changes depending on the shape of the substrate W to be supported. FIG. 6 shows an example of modification of the pad 20 according to the first embodiment. FIG. 6 shows deformation of the pad 20 when the substrate W shown in FIG. 5 is held on the end effector 10. In the case of holding the downwardly protruding substrate W shown in FIG. 5, the inner side of the pad 20 in the radial direction of the substrate W is pressed and deformed to protrude downward, and the force that causes deformation in a reverse direction is applied to the outer side of the pad 20. Accordingly, the pad 20 is inclined inwardly to correspond to the inclination of the substrate W. The inner deformation gauge 25 is deformed in a compression direction. The outer deformation gauges 25 is deformed in a tensile direction.

The deformation of the deformation gauge 25 changes depending on the shape of the substrate W. Therefore, the deformation of the substrate W, such as warpage or the like, can be specified by detecting the deformation of the deformation gauge 25.

The controller 310 specifies a degree of deformation of the substrate W based on the deformation detection results of the deformation gauges 25. For example, the controller 310 obtains the average of absolute values of deformation amounts of the inner and outer deformation gauges 25 for each pad 20 to obtain the average deformation amount for each pad 20. Then, the controller 310 specifies a degree of deformation of the substrate W from the average deformation amount for each pad 20. For example, the average deformation amount for each pad 20 in the case where the transfer mechanism 308 holds a substrate W that is not deformed or a substrate W which various deformations such as warpage and the like have occurred is obtained in advance by a test, simulation, or the like. Then, the average deformation amount for each pad 20 is stored, as shape data, in the storage part 312 for each shape of the substrate W. For example, the average deformation amount for each pad 20 is stored in the shape data for each warpage amount and each warpage direction of the substrate W. The controller 310 uses the shape data stored in the storage part 312 to specify the shape of the substrate W corresponding to the average deformation amount for each pad 20. For example, the controller 310 specifies the warpage amount or the warpage direction of the substrate W.

The controller 310 controls the transfer of the substrate W depending on the specified degree of deformation of the substrate W. The controller 310 controls the substrate W to be transferred when the degree of deformation of the substrate W is within an allowable range for transfer. For example, when the warpage amount of the substrate W is within the allowable range, the controller 310 controls the substrate W to be transferred. On the other hand, when the degree of deformation of the substrate W is not within the allowable range for transfer, the controller 310 controls the transfer of the substrate W to be stopped. For example, the controller 310 controls the transfer of the substrate W to be stopped when the warpage amount of the substrate W is not within the allowable range.

Here, the substrate processing apparatus 200 sequentially transfers the substrates W to the chambers 201 to 204 and performs substrate processing. In the substrate processing apparatus 200, the deformation of the substrate W may change over time due to the changes in the characteristics of the chambers 201 to 204 over time even when the same substrate is processed. For example, the substrate W may be warped over time although the transfer of the substrate W is not affected.

Therefore, the controller 310 stores the degree of deformation of the substrate W, as history data, in the storage part 312. For example, the controller 310 stores the warpage amount and the warpage direction of the substrate W in the history data. The controller 310 may obtain the change in the degree of deformation of the substrate W stored in the history data of the storage part 312, and may output the change in the degree of deformation of the substrate W. For example, the controller 310 outputs the changes in the warpage amount and the warpage direction of the substrate W based on the history data to the user interface 311. Accordingly, it is possible to detect whether or not the substrate W is warped. When the substrate W is warped, it is possible to continuously monitor the changes in the warpage amount and the warpage direction.

The controller 310 may perform control to output warning when the change in the degree of deformation of the substrate W exceeds a certain threshold value. For example, the controller 310 outputs warning to the user interface 311 when the changes in the warpage amount or the warpage direction of the substrate W exceeds a certain threshold value. Accordingly, it is possible to notify that the degree of deformation of the substrate W has changed.

Further, the controller 310 may specify a degree of deformation of the substrate W before and after the substrate processing in the chambers 201 to 204, and may output warning when the change in the degree of deformation of the substrate W before and after the substrate processing exceeds a certain threshold value. Accordingly, it is possible to notify that the processing characteristics of the chambers 201 to 204 have been changed.

In the above embodiment, the case where the deformation gauges 25 are provided at the inner side and the outer side of the pad 20 has been described as an example. However, the present disclosure is not limited thereto. The deformation gauge 25 may be provided only at the inner side or the outer side of the pad 20. The deformation of the deformation gauge changes depending on the shape of the substrate W regardless of whether the deformation gauge 25 is provided at the inner side or the outer side of the pad 20. Therefore, even when the deformation gauge 25 is provided only at the inner side or the outer side of the pad 20, the deformation of the substrate W, such as warpage or the like, can be specified by detecting the deformation of the deformation gauge 25. The pad 20 is deformed considerably depending on the shape of the substrate W in the radial direction of the substrate W, and is also deformed depending on the shape of the substrate W in a direction intersecting the radial direction of the substrate W. Therefore, the deformation gauge 25 may be provided for the pad 20 in a direction intersecting the radial direction of the substrate W.

In the above embodiment, the case where each pad 20 is provided with the deformation gauge 25 has been described as an example. However, the present disclosure is not limited thereto. At least one pad 20 may be provided with the deformation gauge 25. In the overall deformation of the substrate W, such as warpage or the like, each pad 20 is deformed depending on the shape of the substrate W. Therefore, the overall deformation of the substrate W such as warpage or the like can be specified by detecting the deformation of the deformation gauge 25 of one pad 20.

In the above embodiment, the end effector 10 of the transfer mechanism 308 provided in the atmosphere transfer chamber 303 has been described as an example. However, the present disclosure is not limited thereto. Also in the end effector 11 of the transfer mechanism 306 provided in the vacuum transfer chamber 301, the pad that is brought into contact with the substrate W is deformed depending on the shape of the substrate W. Therefore, the deformation of the substrate W may be specified by providing a deformation gauge at a pad disposed at a portion of the end effector 11 of the transfer mechanism 306 that is brought into contact with the substrate W and detecting the deformation of the deformation gauge. In this case, the end effector 11 corresponds to the substrate placing portion of the present disclosure. By providing the deformation gauge at the pad of the end effector 11 of the transfer mechanism 306, it is possible to specify the deformation of the substrate W immediately before it is transferred to the chambers 201 to 204 and processed or immediately after it is processed. On the other hand, the end effector 10 of the transfer mechanism 308 sucks and attracts the substrate W in an atmospheric pressure space, so that the pad 20 is deformed considerably depending on the shape of the substrate W. Therefore, fine deformation of the substrate W can be specified by providing the deformation gauge at the pad 20 for suction and attraction.

In the above embodiment, the case where the transfer mechanism 306 and the transfer mechanism 308 are configured as articulated arms has been described as an example. However, the present disclosure is not limited thereto. The transfer mechanism 306 and the transfer mechanism 308 may have any configuration as long as they have an end effector for supporting the substrate and can transfer the substrate W.

Figure 7:
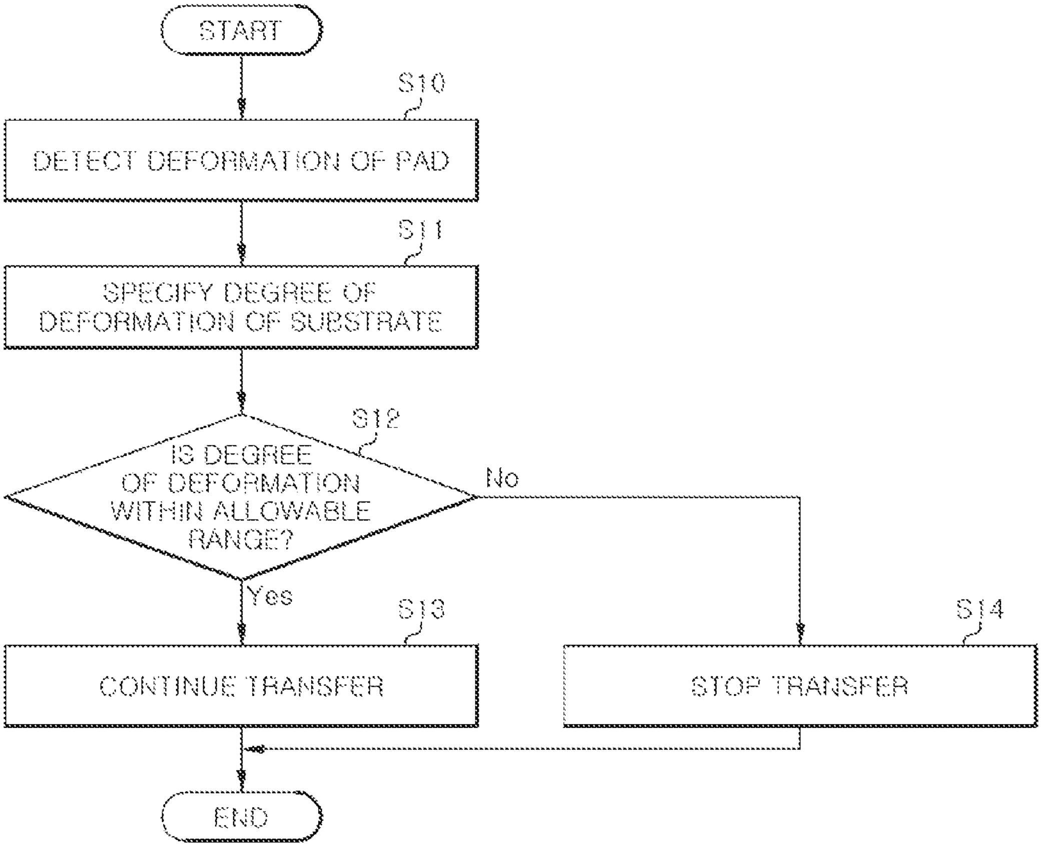
FIG. 7 is a flowchart showing an example of the flow of a substrate transfer process according to the first embodiment.

Next, the flow of the substrate transfer process including the substrate shape specifying method according to the first embodiment will be described. FIG. 7 is a flowchart showing an example of the flow of the substrate transfer process according to the first embodiment.

When the transfer mechanism 308 transfers the substrate W, the detector 15 detects the deformation of the pad 20 (step S10). For example, the detector 15 detects the deformation of the deformation gauges 25 provided at the inner side and the outer side of each pad 20 and outputs data indicating the deformation amount to the controller 310.

The controller 310 specifies a degree of deformation of the substrate W based on the detection result of the detector (step S11). For example, the controller 310 obtains the average of absolute values of deformation amounts of the inner and outer deformation gauges 25 for each pad 20 to obtain the average deformation amount for each pad 20. Then, the controller 310 specifies a degree of deformation of the substrate W from the average deformation amount for each pad 20.

The controller 310 determines whether or not a degree of deformation of the substrate W is within the allowable range for transfer (step S12). If a degree of deformation of the substrate W is within the allowable range for transfer (step S12: Yes), the controller 310 continues the transfer operation (step S13).

On the other hand, when a degree of deformation of the substrate W is not within the allowable range for transfer (step S12: No), the controller 310 controls the transfer operation to be stopped (step S14).

Figure 8:
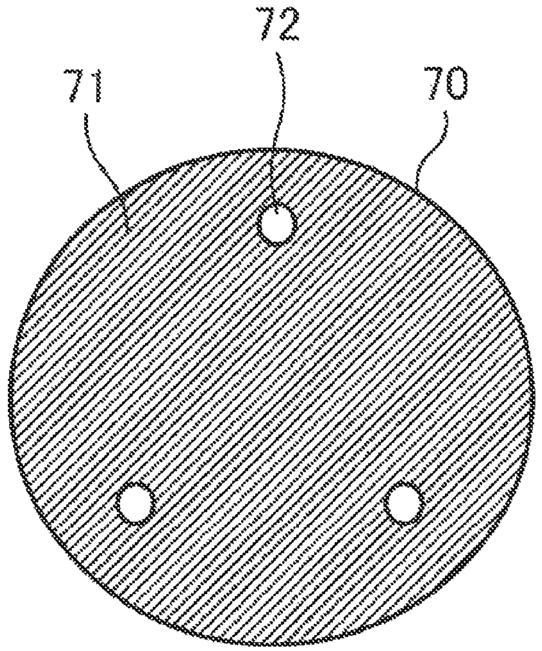
FIG. 8 is a schematic configuration diagram showing an example of a stage according to the first embodiment.

In the above embodiment, the case where the deformation of the substrate W placed on the end effector 10 of the transfer mechanism 308 or the end effector 11 of the transfer mechanism 306 is detected has been described as an example. However, the present disclosure is not limited thereto. In the substrate processing apparatus 200, the deformation of the substrate W may be detected at any portion on which the substrate W is placed. In other words, the substrate placing portion of the present disclosure may be any portion on which the substrate W is placed. For example, a stage on which the substrate W is placed is provided in the load-lock chambers 302, the alignment chamber 304, and the chambers 201 to 204. The stage may also be provided in the vacuum transfer chamber 301 or the atmospheric transfer chamber 303. Further, in the substrate processing apparatus, a plurality of vacuum transfer chambers may be connected to a relay chamber (for example, buffer chamber), and a substrate W may be placed on the stage disposed in the relay chamber and relayed between the vacuum transfer chambers. The support portions may be provided at the contact portions between the stage and the substrate W, and the deformation of the support portions is detected. A degree of deformation of the substrate W may be specified based on the detection result. Next, an example of the configuration of the stage will be described. Hereinafter, an example of the stage will be described. FIG. 8 is a schematic configuration diagram showing an example of the stage according to the first embodiment. A stage 70 on which the substrate W is placed is provided in the load-lock chambers 302 and the alignment chamber 304. FIG. 8 is a schematic top view of the stage 70. The upper surface of the stage 70 serves as a placing surface 71 on which the substrate W is placed. The placing surface 71 is formed in a circular shape that is similar to that of the substrate W. The support portions that are at least partially deformed by the contact with the substrate W and support the substrate W are disposed at portions of the placing surface 71 that are brought into contact with the substrate W. The support portions are provided in the circumferential direction of the substrate W. For example, three pads 72 are disposed at the placing surface 71 while being spaced apart from each other in a concentrical shape. The pads 72 have the same configuration as that of the pads 20. Further, the pads 72 are at least partially deformed by the contact with the substrate W and support the substrate W. The substrate W is supported by three pads 72 while being separated from the placing surface 71. Similarly to the pads 20, the pads 72 are provided with the deformation gauges and connected to a detector (not shown) through wiring (not shown) so that the deformation of the pad 72 can be detected. The controller 310 may specify a degree of deformation of the substrate W based on the detection result of the deformation of each pad 72 that is obtained by a detector (not shown).

As described above, the substrate processing apparatus 200 according to the first embodiment includes the substrate placing portion (for example, the end effectors 10 and 11, the stage 70), the support portions (for example, the pads 20 and 72), the detector (for example, the detector 15), and the controller 310. The substrate W is placed on the substrate placing portion. The support portions are disposed at the portions of the substrate placing portion that are brought into contact with the substrate W. The support portions are at least partially deformed by the contact with the substrate W, and support the substrate W. The detector detects the deformation of the support portions. The controller 310 specifies a degree of deformation of the substrate W based on the detection result of the detector. Accordingly, in the substrate processing apparatus 200 according to the first embodiment, the deformation of the substrate W can be detected. Hence, in the substrate processing apparatus 200, the warpage amount of the substrate W can be easily measured without using a dedicated measuring device. Further, in the substrate processing apparatus 200, the deformation of all substrates W to be processed can be detected by placing the substrate W to be processed on the substrate placing portion. Since the substrate processing apparatus 200 can detect the deformation of all substrates W, the change that does not tend to cause abnormality can be captured, leading to the prediction of apparatus abnormality and yield fluctuation.

Further, the support portions are provided at multiple locations of the substrate placing portion (for example, the end effectors 10 and 11, and the stage 70) in the circumferential direction of the substrate W. The detector detects deformation of at least one support portion. The controller 310 specifies a degree of deformation of the substrate W based on the detection result of the detector. In this manner, in the substrate processing apparatus 200, the deformation of the substrate W can be detected by detecting the deformation of at least one support portion.

Further, the controller 310 specifies a degree of warpage and a warpage direction of the substrate W based on the detection result of the detector. Accordingly, in the substrate processing apparatus 200, a degree of warpage and a warpage direction of the substrate W can be detected by placing the substrate W on the substrate placing portion during the substrate processing.

Further, the support portions includes the pads (for example, the pads 20 and 72) that form portions to be in contact with the substrate W and are elastically deformed by the contact with the substrate W, and the deformation gauges (for example, the deformation gauges 25) disposed at the pads. The detector detects deformation of the deformation gauges. In this manner, in the substrate processing apparatus 200, the deformation of the substrate W, such as warpage or the like, can be specified by detecting the deformation of the deformation gauges 25.

Further, the pads (for example, the pads 20) have suction ports (the suction ports 21) formed on the surfaces facing the substrate W, and attract the substrate W. Accordingly, the substrate processing apparatus 200 can specify fine deformation of the substrate W.

When the specified degree of deformation of the substrate W is not within the allowable range, the controller 310 controls the transfer of the substrate W to be stopped. Accordingly, in the substrate processing apparatus 200, it is possible to prevent the transfer of the substrate W when the degree of deformation is not within the allowable range.

Further, the end effectors (for example, the end effectors 10 and 11) disposed at the transfer mechanisms (for example, the transfer mechanisms 306 and 308) for transferring the substrate W serve as the substrate placing portion. Accordingly, in the substrate processing apparatus 200, the degree of deformation of the substrate W can be specified when the substrate W is transferred by the transfer mechanism, which makes it possible to detect abnormality of the substrate W without deteriorating the throughput.

Further, the transfer mechanism loads and unloads the substrate W into and from the substrate processing parts (the chambers 201 to 204) for performing substrate processing. The controller 310 specifies a degree of deformation of the substrate W before and after the substrate processing in the substrate processing parts, and performs control to output warning when the change in the degree of deformation of the substrate W before and after the substrate processing exceeds a certain threshold value. Accordingly, in the substrate processing apparatus 200, it is possible to notify that the processing characteristics of the substrate processing parts have changed.

Further, the controller 310 stores the degree of deformation of the substrate W in the storage part 312, and performs control to output the change in the degree of deformation of the substrate W that has been stored in the storage part 312. Accordingly, in the substrate processing apparatus 200, the change in the degree of deformation of the substrate W can be detected. Further, in the substrate processing apparatus 200, it is possible to constantly monitor the change in the degree of deformation of the substrate W.

Further, the controller 310 performs control to output warning when the change in the degree of deformation of the substrate W exceeds a certain threshold value. Accordingly, in the substrate processing apparatus 200, it is possible to notify the change in the degree of deformation of the substrate W.

Second Embodiment

Next, a second embodiment will be described. Since the configuration of the substrate processing apparatus 200 according to the second embodiment is the same as that of the substrate processing apparatus 200 according to the first embodiment shown in FIG. 1, the description thereof will be omitted.

Figure 9:
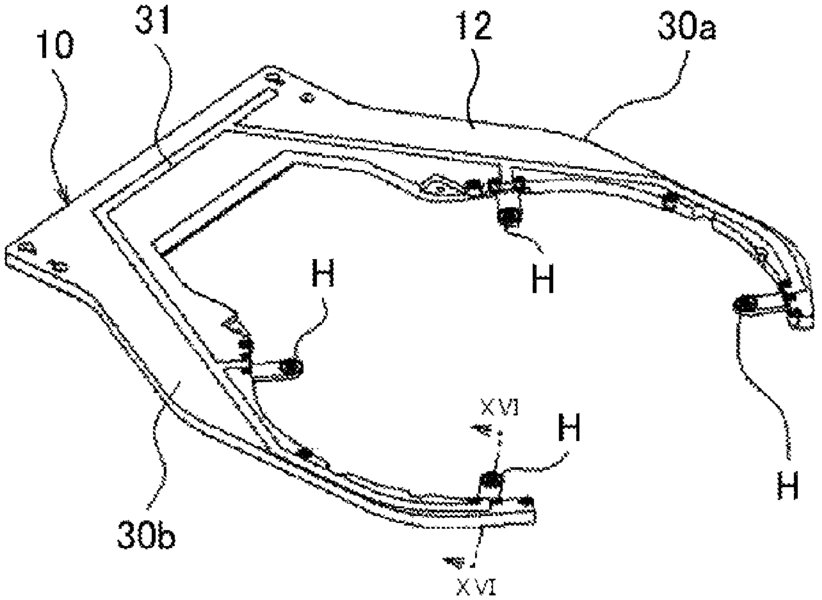
FIG. 9 shows an example of a transfer mechanism according to a second embodiment.

In the second embodiment, another configuration example of the end effector 10 will be described. FIG. 9 shows an example of the transfer mechanism 308 according to the second embodiment. FIG. 9 shows a perspective view showing the configuration of the end effector 10 of the transfer mechanism 308. The end effector 10 has a flat shape, and the upper surface thereof serves as the placing surface 12 on which the substrate W such as a semiconductor wafer or the like is placed. The end effector 10 transfers the substrate W while holding the substrate on the placing surface 12 side. The end effector 10 forms an arm on the tip end side of the transfer mechanism 308. The end effector 10 is made of ceramic. The end effector 10 has a U-shaped tip end. For example, the end effector 10 according to the second embodiment has a substantially horseshoe shape formed by a pair of curved arm pieces 30*a* and 30*b*. A pad unit H is attached to each of four locations under the tip ends and the base ends of the curved arm pieces 30*a* and 30*b*.

Figure 16:
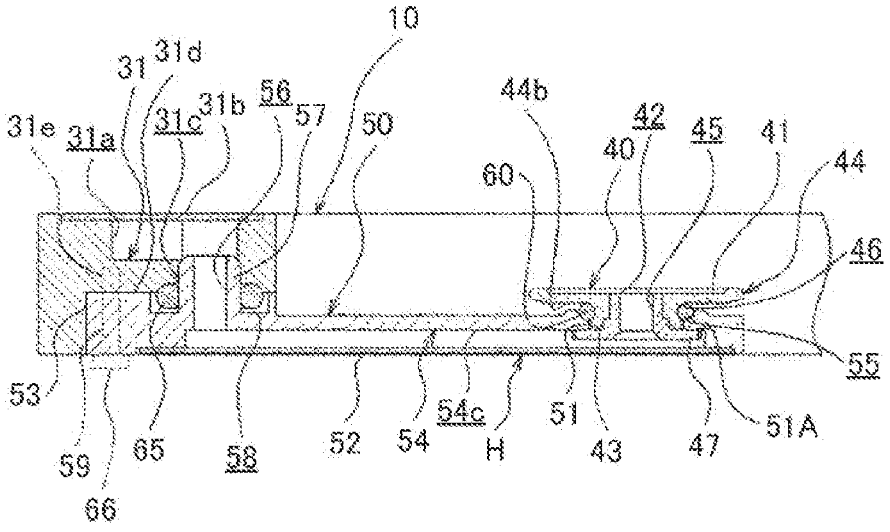
FIG. 16 shows an example of the configuration of the pad unit according to the second embodiment.

The suction passage 31 is formed in the end effector 10. FIG. 16 shows a cross section of a part XVI of FIG. 9. As shown in FIG. 16, the end effector 10 has a groove 31*a* formed on a surface for holding the substrate W. The groove 31*a* communicates from the base end side to a connection hole 31*c* to which each pad unit H is connected. The suction passage 31 is formed by covering and sealing the surface of the groove 31*a* that holds the substrate W with a lid 31*b*. In this case, the connection hole 31*c* is formed from the bottom surface of the groove 31*a* toward the rear surface side, and communicates with a notch 31*d* to which a joint portion 53 of a pad holding member 50 to be described later is connected. Two screw holes 31*e* for fixing the pad unit H with bolts 66 are formed in the bottom surface of the notch 31*d*. The suction passage 31 configured as described above is connected from the base end side of the end effector 10 to a vacuum exhaust part (not shown), and can vacuum-attract the substrate W via the pad units H. In the second embodiment, the pad units H correspond to the support portions of the present disclosure.

The number of locations where the pad units H of the end effector 10 are installed is not limited to four.

Figure 10:
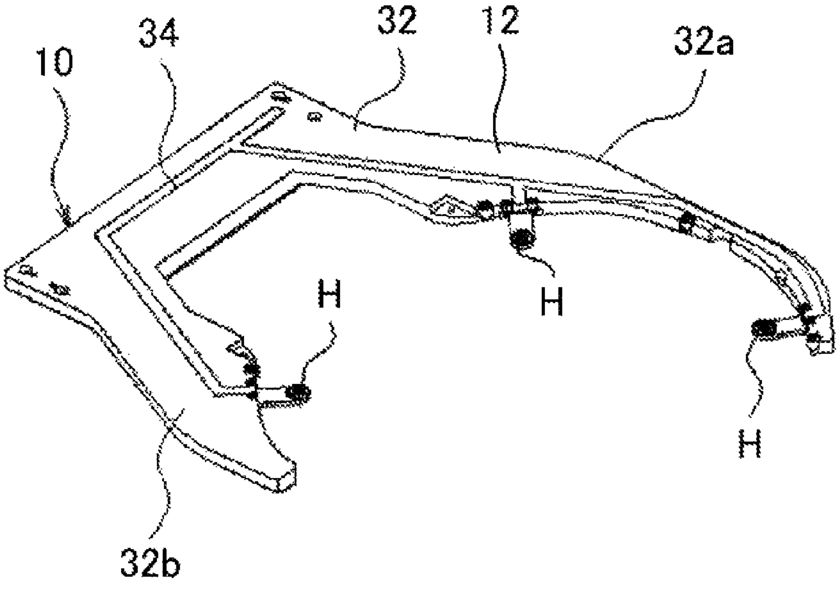
FIG. 10 shows another example of the transfer mechanism according to the second embodiment.

FIG. 10 shows another example of the transfer mechanism 308 according to the second embodiment. FIG. 10 is a perspective view showing another configuration of the end effector 10 of the transfer mechanism 308. The end effector has a modified horseshoe shape formed by a short arm piece 32*b* for avoiding interference of the curved arm piece 32*a* in the device. The pad units H are attached to three locations under the tip end and the base end of the curved arm piece 32*a* and the base end of the short arm piece 32*b*. A suction passage 34 having the same configuration as that of the suction passage 31 is formed in the end effector 10.

FIGS. 11 to 18 show an example of the configuration of the pad unit H according to the second embodiment. The pad unit H has a pad main body 40, an insertion hole 51, the pad holding member 50, and an annular airtight holding member.

As shown in FIGS. 11 to 17, the pad main body 40 has an attracting portion 44, a cylindrical mounting portion 43, and an arc-shaped outer peripheral groove 46 formed in the mounting portion 43. The attracting portion 44 has an attracting surface 41 and a suction port 42 for vacuum-attracting and holding the substrate W. The mounting portion 43 has a suction hole 45 communicating with the suction port 42. The outer peripheral groove 46 is formed from the mounting portion 43 to a bottom surface 44*b* of the attracting portion 44. Further, the attracting portion 44 extends outward from the upper end of the mounting portion 43, and has a disc shape. Further, a locking portion 47 extending outward is formed below the mounting portion 43 of the pad main body 40.

The mounting portion 43 of the pad main body 40 can be inserted into the insertion hole 51. The pad holding member 50 has a communication passage 54 communicating with the suction hole 45 and the suction passage 31, and is fixed to the end effector 10.

The annular airtight holding member is, for example, an elastically deformable O-ring 60 having a circular cross section. The O-ring 60 is disposed between the arc-shaped outer peripheral groove 46 and an arc-shaped inner peripheral groove 55 formed in the insertion hole 51 of the pad holding member 50. The O-ring 60 supports the pad main body 40.

Figure 17:
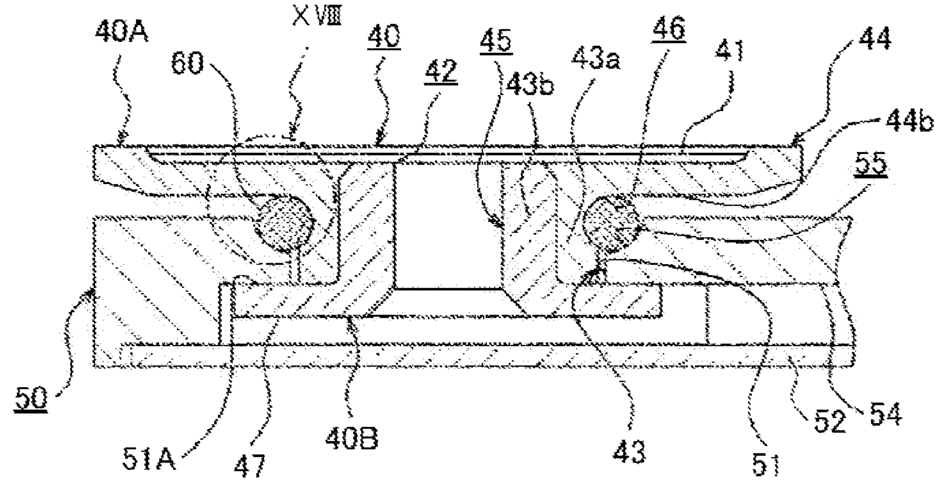
FIG. 17 shows an example of the configuration of the pad unit according to the second embodiment.

As shown in FIG. 17, the pad main body 40 is formed by fitting an upper pad member 40A and a lower pad member 40B. Further, the upper pad member 40A and the lower pad member 40B may be made of synthetic resin such as polybenzimidazole (PBI) or the like, but is preferably made of reinforced synthetic resin in which carbon fiber is contained in PBI.

The upper pad member 40A has an outer cylindrical mounting portion 43*a*, the attracting portion 44, and the arc-shaped outer peripheral groove 46. The attracting portion 44 extends outward from the upper end of the outer cylindrical mounting portion 43*a*, and has a disc shape. The attracting portion 44 has the attracting surface 41 on a surface thereof. The outer peripheral groove 46 is formed from the outer cylindrical mounting portion 43*a* to the bottom surface 44*b* of the attracting portion 44.

On the other hand, the lower pad member 40B has an inner cylindrical mounting portion 43*b*, a suction port 42, a suction hole 45, and a locking portion 47. The suction port 42 is formed at the upper end of the inner cylindrical mounting portion 43*b*. The suction hole 45 is formed to penetrate from the suction port 42 to the lower end of the inner cylindrical mounting portion 43*b*. The locking portion 47 extends outward from the lower end of the inner cylindrical mounting portion 43*b*.

The pad main body 40 is assembled by fitting the outer cylindrical mounting portion 43*a* formed at the upper pad member 40A and the inner cylindrical mounting portion 43*b* formed at the lower pad member 40B with an adhesive.

In this case, the cylindrical mounting portion 43 having the suction hole 45 communicating with the suction port 42 is formed at the pad main body 40 by the outer cylindrical mounting portion 43*a* of the upper pad member 40A and the inner cylindrical mounting portion 43*b* of the lower pad member 40B.

As shown in FIGS. 11 to 16 and 19, the pad holding member 50 has the insertion hole 51, the communication passage 54, and the arc-shaped inner peripheral groove 55. The mounting portion 43 of the pad main body 40 can be inserted into the insertion hole 51. The communication passage 54 communicates with the suction hole 45 and the suction passage 31. The inner peripheral groove 55 is formed along the opening edge of the insertion hole 51. A locking stepped portion 51A to which the locking portion 47 of the pad main body 40 can be locked is formed at the outer side of the lower end of the insertion hole 51.

Further, the joint portion 53 for detachably fixing the pad holding member 50 to the end effector 10 is formed at one end of the pad holding member 50. The joint portion 53 is fixed to the end effector 10 via a sealing member such as a sealing O-ring 65.

The communication passage 54 is formed in the pad holding member 50. As shown in FIG. 16, a groove 54*c* is formed on the surface (rear surface) of the pad holding member 50 from one inner side to the other inner side, the surface (rear surface) is opposite to the surface of the pad holding member 50 that holds the substrate W. The communication passage 54 is formed by covering and sealing the groove 54*c* with the lid 52.

Figure 13:
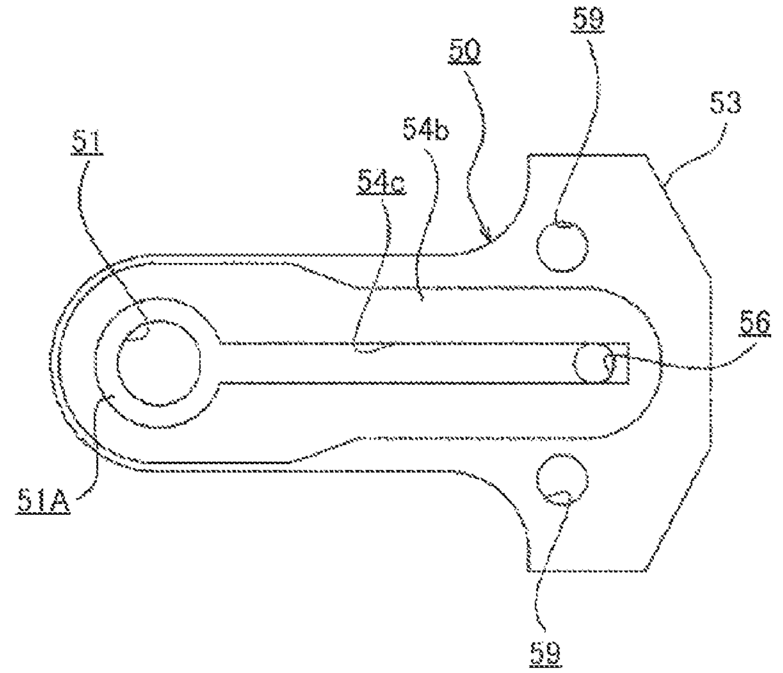
FIG. 13 shows an example of the configuration of the pad unit according to the second embodiment.
Figure 14:
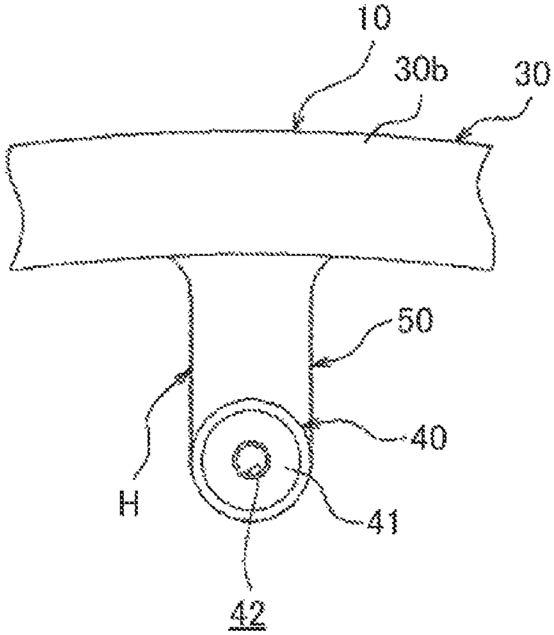
FIG. 14 shows an example of the configuration of the pad unit according to the second embodiment.
Figure 15:
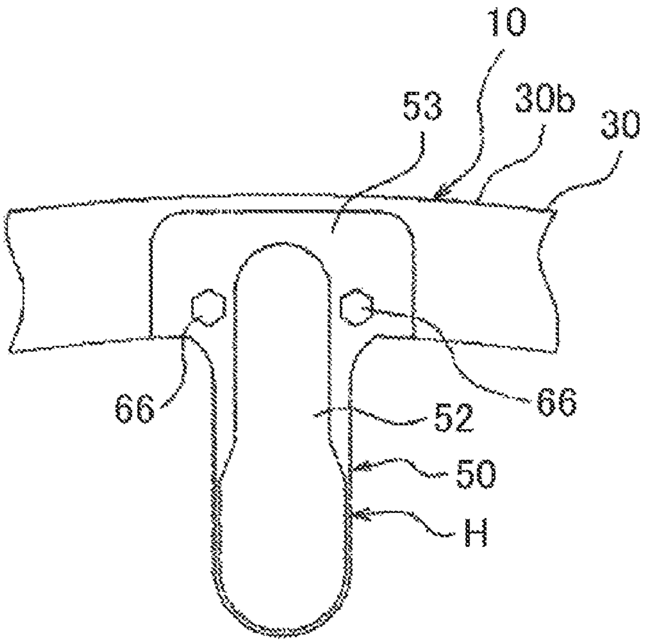
FIG. 15 shows an example of the configuration of the pad unit according to the second embodiment.

As shown in FIGS. 13 and 16, the pad holding member 50 has on a surface thereof an insertion hole 51 into which the mounting portion 43 of the pad main body 40 can be inserted. The insertion hole 51 communicates with one end of the communication passage 54. Further, the pad holding member 50 has on a surface thereof a communication hole 56 for communicating with the suction passage 31. The communication hole 56 communicates with the other end of the communication passage 54. Further, the pad holding member 50 has on a rear surface thereof a lid receiving groove 54*b* for insertion-fitting the lid 52 that seals the groove 54*c* from the rear surface side.

Figure 11:
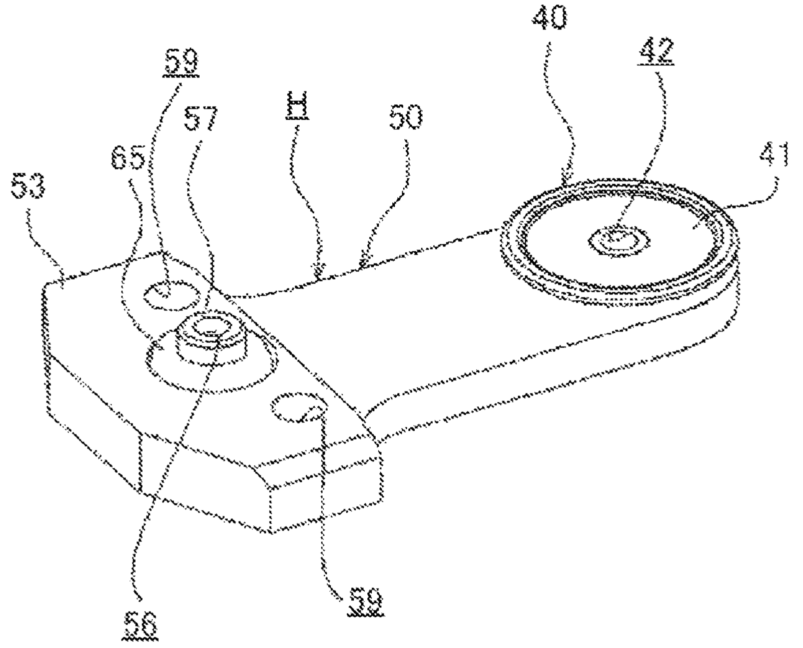
FIG. 11 shows an example of a configuration of a pad unit according to the second embodiment.
Figure 12:
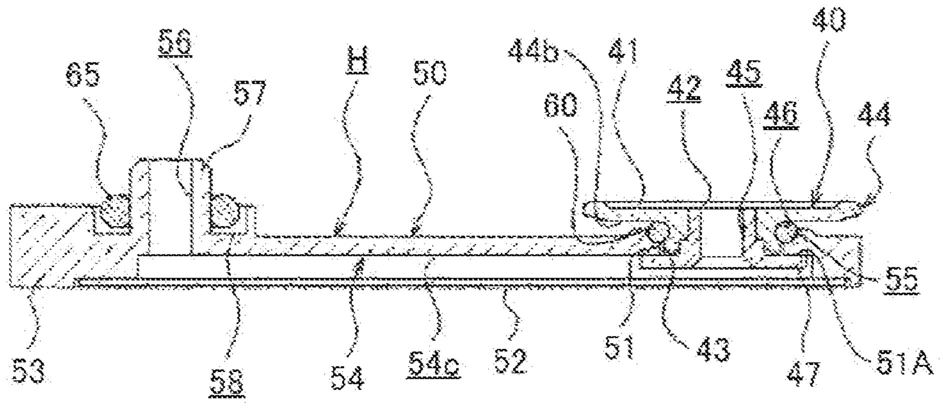
FIG. 12 shows an example of the configuration of the pad unit according to the second embodiment.

As shown in FIGS. 11, 12, and 13, the joint portion 53 has a cylindrical protrusion 57. The above-described communication hole 56 penetrates through the protrusion 57. Further, a circumferential groove 58 is formed at the joint portion 53 to surround the outer circumference of the protrusion 57 on the base end side. A sealing member, such as an elastically deformable sealing O-ring 65 made of synthetic rubber, is inserted into the circumferential groove 58 to maintain the airtightness of the connecting portion with the end effector 10. As shown in FIGS. 11, 13, and 16, two through-holes 59 are formed in the joint portion 53 to correspond to the screw holes 31*e* formed in the notch 31*d* of the end effector 10. When the joint portion 53 is fitted into the notch 31*d*, the through-holes 59 communicate with the screw holes 31*e*.

Figure 18:
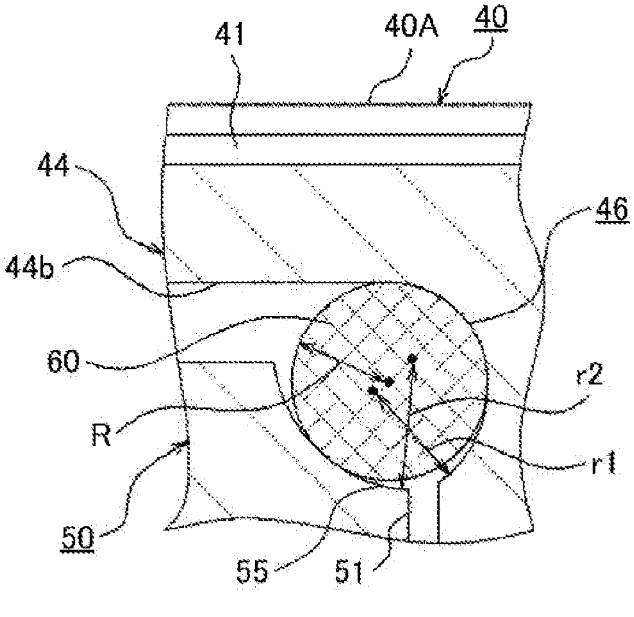
FIG. 18 shows an example of the configuration of the pad unit according to the second embodiment.

As shown in FIGS. 12, 16 and 17, the elastically deformable O-ring 60 made of synthetic rubber and having a circular cross section is used as the annular airtight holding member, for example. FIG. 18 shows the vicinity of a part XVIII of FIG. 17. As shown in FIG. 18, a radius of curvature r1 of the inner peripheral groove 55 formed in the pad holding member 50 and a radius of curvature r2 of the outer peripheral groove 46 formed in the pad main body 40 are slightly greater than a radius R of the circular cross section of the O-ring 60. Further, the upper portion of the O-ring 60 protrudes from the surface of the pad holding member 50 when it is supported by the inner circumferential groove 55.

In order to assemble the pad unit H to the end effector configured as described above, as shown in FIGS. 14 to 16, the end portion of the pad unit H where the pad main body 40 is disposed faces the inner peripheral side of the end effector 10. Then, the protrusion 57 of the pad holding member 50 is inserted into the connection hole 31*c* formed on the rear surface of the end effector 10 from the rear surface side, and the joint portion 53 is fitted into the notch 31*d*. At this time, the sealing O-ring 65 is elastically deformed and interposed between the end effector 10 and the pad holding member 50. Next, the bolts 66 are inserted into the through-holes 59 formed in the joint portion 53 from the rear surface side and screwed into the screw holes 31*e* of the end effector 10. In this manner, the pad holding member 50 is detachably fixed to the transfer arm body 33 via the sealing O-ring 65.

As shown in FIG. 9, the pad unit H is attached such that the end portion of the pad unit H where the pad main body 40 is disposed faces the inner peripheral side from the position below the tip end portions and the base end portions of the curved arm pieces 30*a* and 30*b*. The substrate W transferred by the end effector 10 is stably held by the contact with the inner peripheral side surfaces of the curved arm pieces 30*a* and 30*b* and the vacuum attraction obtained by the pad units H disposed at four positions of the peripheral portion of the backside of the substrate W.

On the other hand, in the end effector 10 shown in FIG. 10, the pad units H are attached to three locations, i.e., the positions below the tip end and the base end of the curved arm piece 32*a* and the base end of the short arm piece 32*b*. The end effector 10 shown in FIG. 10 is stably held by vacuum attraction obtained by the pad units H disposed at the three locations.

Next, the holding state of the substrate W on the end effector 10 according to the second embodiment will be described.

Figure 19:
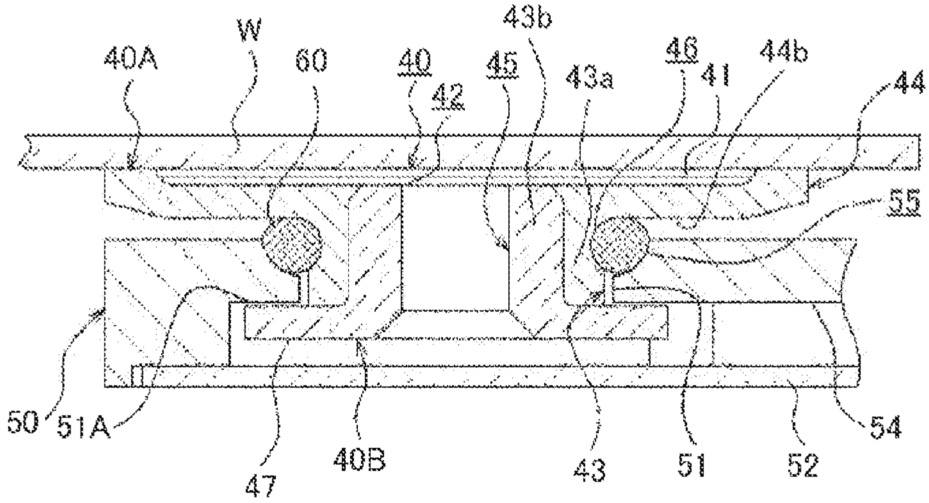
FIG. 19 is an enlarged cross-sectional view of a main portion of the pad unit according to the second embodiment.

FIG. 19 is an enlarged cross-sectional view of a main portion of the pad unit H according to the second embodiment. FIG. 19 shows a state in which the end effector 10 vacuum-attracts a substrate W without warpage or deformation (flat substrate W). When the pad unit H vacuum-attracts the flat substrate W against the attracting surface 41, a suction hole and the communication passage 54 in the pad unit H have a negative pressure, and the pad main body 40 is slightly lowered. In this case, even if the O-ring 60 is elastically deformed by the downward movement of the pad main body 40, the O-ring 60 is in surface contact with the arc-shaped outer peripheral groove 46 formed in the pad main body 40 and the arc-shaped inner peripheral groove 55 formed in the pad holding member 50, thereby maintaining airtightness.

Figure 20:
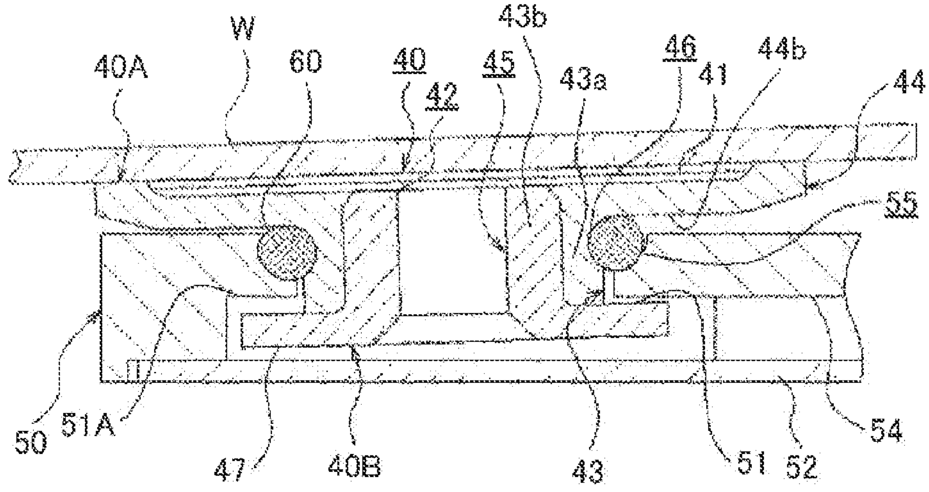
FIG. 20 is an enlarged cross-sectional view of a main portion of the pad unit according to the second embodiment.

FIG. 20 is an enlarged cross-sectional view of a main portion of the pad unit H according to the second embodiment. FIG. 20 shows a state in which the end effector 10 vacuum-attracts a substrate W that is warped upward from the central portion toward the peripheral portion (curved substrate W). When the curved substrate W is placed on the pad unit H, the O-ring 60 is elastically deformed by the warpage of the substrate W, and the substrate W is vacuum-attracted by setting the suction hole 45 and the communication passage 54 in the pad unit H to a negative pressure in a state where the attracting surface 41 is inclined for each pad main body 40. Even if the O-ring 60 is elastically deformed by the inclination of the pad main body 40, the O-ring 60 is in surface contact with the arc-shaped outer peripheral groove 46 formed in the pad main body 40 and the arc-shaped inner peripheral groove 55 formed in the pad holding member 50, thereby maintaining airtightness. Therefore, even if the pad main body 40 is inclined in any direction of 360 degrees, the substrate W can be stably held by vacuum attraction.

Figure 21:
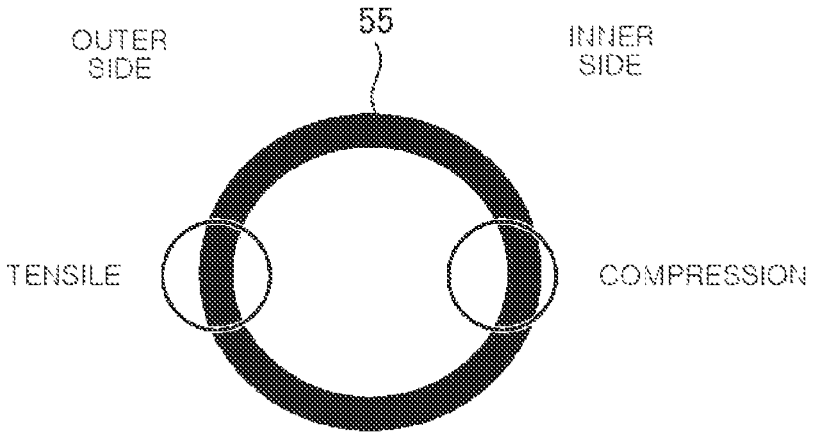
FIG. 21 shows an example of modification of an O-ring according to the second embodiment.

The O-ring 60 is elastically deformed depending on the shape of the substrate W. FIG. 21 shows an example of modification of the O-ring 60 according to the second embodiment. FIG. 21 shows deformation of the O-ring 60 when the pad main body 40 is inclined inward. For example, in the case of holding a downwardly protruding substrate W shown in FIG. 5, the pad main body 40 is inclined inward. Further, an inward compressive force and an outward tensile force are applied to the O-ring 60. Accordingly, the O-ring 60 is deformed.

It is difficult to attach a deformation gauge to the O-ring 60. Thus, in the second embodiment, the change in the electrical characteristics of the O-ring 60 due to elastic deformation are detected. The O-ring 60 is made of resin containing a conductive portion. For example, Non-Patent Document 1 (Yusuke Suzuki et al., "Strain Measurement using carbon-nanotube embedded resin", the 25th Japan Institute of Electronics Packaging Spring Meeting, p. 353-354, March 2011, Japan Institute of Electronics Packaging) discloses that a highly sensitive deformation sensor can be realized because an electrical resistance of a thin film in which carbon nanotubes are dispersed in a resin changes considerably due to deformation. Therefore, in the second embodiment, the O-ring 60 is formed by mixing carbon nanotubes in a resin material and molding them.

Figure 22:
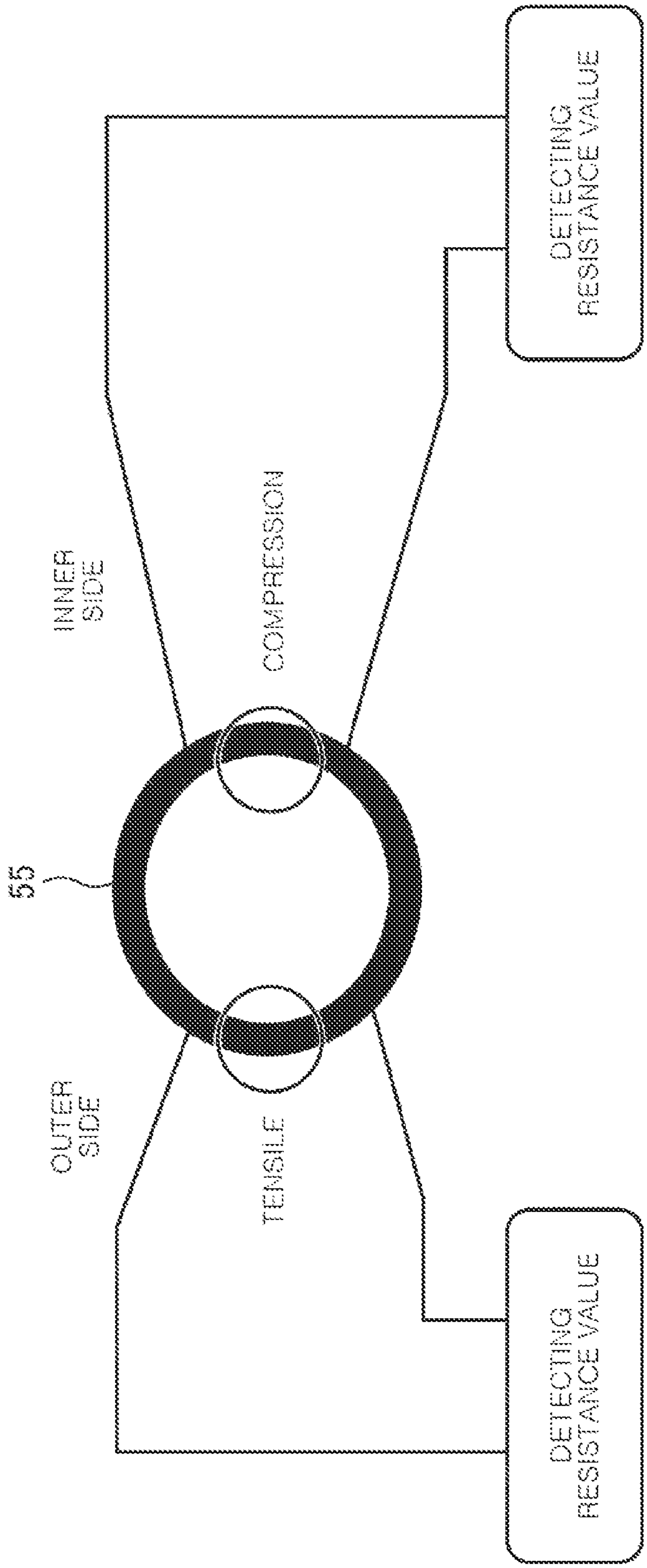
FIG. 22 shows an example of a configuration for detecting an electrical resistance of the O-ring according to the second embodiment.

In the second embodiment, the electrode is disposed at the O-ring 60 to detect a change in the electrical resistance due to the deformation of the O-ring 60. The O-ring 60 is connected to the detector 15 through wiring (not shown). The detector 15 may be provided for each O-ring 60. FIG. 22 explains an example of a configuration for detecting the electrical resistance of the O-ring 60 according to the second embodiment. For example, two electrodes spaced apart from each other are respectively disposed at the surfaces on the inner side and the outer side of the O-ring 60 in the radial direction of the substrate W at the time of placing the substrate W on the end effector 10. The electrodes may be fixed to the surface of the O-ring 60 by adhesion or the like, or may be embedded in the O-ring 60. Wiring are connected to the two electrodes on the inner side and the two electrodes on the outer side are connected to the detector 15, and the resistance values between the two electrodes on the inner side and between the two electrodes on the outer side are detected. For example, when a compressive force is applied to the inner side of the O-ring 60 and a tensile force is applied to the outer side of the O-ring 60, the resistance values between the two inner electrodes decreases and the resistance value between the two outer electrodes increases. The detector 15 detects deformation on the inner side and the outer side of each O-ring 60 and outputs data indicating the deformation amount to the controller 310. For example, the detector 15 is provided with a bridge circuit, detects the changes in the resistance values on the inner side and the outer side of the O-ring 60 as voltage changes using the bridge circuit, and outputs data of the detected voltages to the controller 310.

The O-ring 60 is made of resin containing a conductive portion, so that the deformation thereof can be detected. In the second embodiment, the case where the deformation of the O-ring 60 can be detected because carbon nanotubes are contained in the O-ring 60 has been described as an example. However, the present disclosure is not limited thereto. The material or the configuration of the O-ring 60 may vary as long as the deformation of the O-ring 60 can be detected. For example, the deformation of the O-ring 60 may be detected by printing a deformation gauge on a surface thereof with metal ink. For example, the deformation of the O-ring 60 may be detected by embedding a Cu thin film in a surface of resin by photolithography and etching and using the Cu thin film as a deformation sensor. Further, the deformation of the O-ring 60 may be detected by forming a circuit corresponding to a deformation gauge in the resin using a 3D printer. For example, the deformation of the O-ring 60 may be detected by laminating resins using a 3D printer and embedding a metal serving as a deformation gauge in the resins during the lamination of the resins. Further, the O-ring 60 may be formed by processing conductive resin into a woven fabric, and the deformation of the O-ring 60 may be detected because the contact area of the fabric changes due to deformation.

The controller 310 specifies a degree of deformation of the substrate W based on the detection result of deformation of the O-ring 60. For example, the controller 310 obtains the average of absolute values of deformation amounts on the inner side and the outer side of the O-ring 60 for each pad to obtain the average deformation amount for each pad 20. Then, the controller 310 specifies the degree of deformation of the substrate W from the average deformation amount of each pad 20. For example, the average deformation amount for each pad 20 in the case where the transfer mechanism 308 holds a substrate W that is not deformed or a substrate W where various deformations such as warpage and the like have occurred is obtained in advance by a test, simulation, or the like. Then, the average deformation amount for each pad 20 is stored, as shape data, in the storage part 312 for each shape of the substrate W. For example, the average deformation amount for each pad 20 is stored in the shape data for each warpage amount and each warpage direction of the substrate W. The controller 310 uses the shape data stored in the storage part 312 to specify the shape of the substrate W corresponding to the average deformation amount for each pad 20. For example, the controller 310 specifies the warpage amount or the warpage direction of the substrate W.

In this manner, in the substrate processing apparatus 200, the deformation of the substrate W can be detected even in the case of using the end effector 10 according to the second embodiment.

As described above, the substrate processing apparatus 200 according to the second embodiment includes the substrate placing portion (for example, the end effector 10), the support portions (for example, the pad units H), the detector (for example, the detector 15), and the controller 310. The substrate W is placed on the substrate placing portion. The support portions are disposed at the portions of the substrate placing portion that are brought into contact with the substrate W. The support portions are at least partially deformed by the contact with the substrate W, and support the substrate W. The detector detects the deformation of the support portions. The controller 310 specifies a degree of deformation of the substrate W based on the detection result of the detector. Accordingly, in the substrate processing apparatus 200 according to the first embodiment, the deformation of the substrate W can be detected.

Further, the support portions according to the second embodiment include the pads (for example, the pad main body 40) forming portions to be in contact with the substrate W, and the O-ring (for example, the O-ring 60) that supports the pads and is elastically deformed. The detector 15 detects the deformation of the O-ring. Accordingly, in the substrate processing apparatus 200, the deformation of the substrate W, such as warpage or the like, can be specified by detecting the deformation of the O-ring.

Further, the O-ring (for example, the O-ring 60) according to the second embodiment is made of resin containing a conductive portion. Accordingly, the deformation of the O-ring can be detected with high accuracy.

Further, it should be noted that the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

Further, the following additional statements are disclosed with respect to the above embodiments.

(Appendix 1)

A substrate processing apparatus comprising:

a substrate placing portion on which a substrate is placed;

one or more support portions configured to support the substrate and disposed at portions of the substrate placing portion that are brought into contact with the substrate, said one or more support portions being at least partially deformed by the contact with the substrate;

a detector configured to detect deformation of the support portion; and a controller configured to specify a degree of the deformation of the substrate based on the detection result of the detector.

(Appendix 2)

The substrate processing apparatus of Appendix 1, wherein the one or more support portions are disposed at multiple locations of the substrate placing portion in a circumferential direction of the substrate, the detector detects deformation of at least one of the one or more support portions, and the controller specifies a degree of the deformation of the substrate based on the detection result of the detector.

(Appendix 3)

The substrate processing apparatus of Appendix 1 or 2, wherein the controller specifies a degree of warpage and a direction of warpage of the substrate based on the detection result of the detector.

(Appendix 4)

The substrate processing apparatus of any one of Appendices 1 to 3, wherein each of the one or more support portions includes:

a pad that is brought into contact with the substrate and is elastically deformed by the contact with the substrate; and a deformation gauge disposed at the pad, wherein the detector detects deformation of the deformation gauge.

(Appendix 5)

The substrate processing apparatus of any one of Appendices 1 to 3, wherein each of the one or more support portions includes:

a pad that is brought into contact with the substrate, and an O-ring that supports the pad and is elastically deformed, wherein the detector detects deformation of the O-ring.

(Appendix 6)

The substrate processing apparatus of Appendix 5, wherein the O-ring is made of resin containing a conductive portion.

(Appendix 7)

The substrate processing apparatus of any one of Appendices 1 to 6, wherein each of the one or more support portions has suction port formed in a surface facing the substrate and attracts the substrate.

(Appendix 8)

The substrate processing apparatus of any one of Appendices 1 to 7, wherein the controller controls transfer of the substrate to be stopped when specified degree of the deformation of the substrate is not within an allowable range.

(Appendix 9)

The substrate processing apparatus of any one of Appendices 1 to 8, wherein the substrate placing portion is an end effector disposed at a transfer mechanism configured to transfer the substrate.

(Appendix 10)

The substrate processing apparatus of Appendix 9, wherein the transfer mechanism loads and unloads the substrate into and from a substrate processing unit where substrate processing is performed, and the controller specifies a degree of the deformation of the substrate before and after the substrate processing performed in the substrate processing unit, and performs control to output warning when a change in the degree of the deformation of the substrate exceeds a certain threshold value.

(Appendix 11)

The substrate processing apparatus of any one of Appendices 1 to 10, wherein the controller stores a degree of the deformation of the substrate in a storage part, and performs control to output a change in the degree of the deformation of the substrate stored in the storage part.

(Appendix 12)

The substrate processing apparatus of Appendix 11, wherein the controller performs control to output warning when the change in the degree of deformation of the substrate exceeds a certain threshold value.

(Appendix 13)

A substrate shape specifying method comprising:

detecting deformation of one or more support portions configured to support a substrate using a detector, the one or more support portions being disposed at a portion of a substrate placing portion on which a substrate is placed that is brought into contact with a substrate, the one or more support portions being at least partially deformed by the contact with the substrate; and specifying a degree of the deformation of the substrate based on the detection result of the detector.

(Appendix 14)

A transfer device for transferring a substrate, comprising:

an end effector on which a substrate is placed; and one or more support portions configured to support the substrate and disposed at a portion of the end effector that is brought into contact with the substrate, at least one of the one or more support portions being at least partially deformed by the contact with the substrate, and the deformation of the support portion being detectable.

(Appendix 15)

An end effector comprising:

a placing surface on which a substrate is placed; and one or more support portions configured to support the substrate and disposed at a portion of the placing surface that is brought into contact with the substrate, at least one of the one or more support portion being at least partially deformed by the contact with the substrate, and the deformation of the support portion being detectable.

The invention claimed is:

1. A substrate processing apparatus comprising:

a substrate placing portion having a flat shape, the substrate placing portion including an upper surface on which a substrate is placed;

one or more support portions configured to support the substrate, directly connected to the substrate placing portion, and disposed at portions of the substrate placing portion that are brought into contact with the substrate, said one or more support portions being at least partially deformed by the contact with the substrate such that the one or more support portions move relative to the substrate placing portion;

a detector configured to detect deformation of the support portion including an amount of inclined angle of the entire support portion with respect to the substrate support portion; and a controller configured to specify a degree of the deformation of the substrate based on the detection result of the detector.

2. The substrate processing apparatus of claim 1, wherein the one or more support portions are disposed at multiple locations of the substrate placing portion in a circumferential direction of the substrate, the detector detects deformation of at least one of the one or more support portions, and the controller specifies a degree of the deformation of the substrate based on the detection result of the detector.

3. The substrate processing apparatus of claim 1, wherein the controller specifies a degree of warpage and a direction of warpage of the substrate based on the detection result of the detector.

4. The substrate processing apparatus of claim 1, wherein each of the one or more support portions includes:

a pad that is brought into contact with the substrate and is elastically deformed by the contact with the substrate; and a deformation gauge disposed at the pad, wherein the detector detects deformation of the deformation gauge.

5. The substrate processing apparatus of claim 1, wherein each of the one or more support portions includes:

a pad that is brought into contact with the substrate, and an O-ring that supports the pad and is elastically deformed, wherein the detector detects deformation of the O-ring.

6. The substrate processing apparatus of claim 5, wherein the O-ring is made of resin material mixed with carbon nanotubes.

7. The substrate processing apparatus of claim 1, wherein each of the one or more support portions has suction port formed in a surface facing the substrate and attracts the substrate.

8. The substrate processing apparatus of claim 1, wherein the controller controls transfer of the substrate to be stopped when specified degree of the deformation of the substrate is not within an allowable range.

9. The substrate processing apparatus of claim 1, wherein the substrate placing portion is an end effector disposed at a transfer mechanism configured to transfer the substrate.

10. The substrate processing apparatus of claim 9, wherein the transfer mechanism loads and unloads the substrate into and from a chamber where substrate processing is performed, and the controller specifies a degree of the deformation of the substrate before and after the substrate processing performed in the chamber, and performs control to output warning when a change in the degree of the deformation of the substrate exceeds a certain threshold value.

11. The substrate processing apparatus of claim 1, wherein the controller stores a degree of the deformation of the substrate in a storage part, and performs control to output a change in the degree of the deformation of the substrate stored in the storage part.

12. The substrate processing apparatus of claim 11, wherein the controller performs control to output warning when the change in the degree of deformation of the substrate exceeds a certain threshold value.

13. A substrate shape specifying method comprising:

detecting deformation of one or more support portions configured to support a substrate using a detector, the deformation of the one or more support portions including an amount of inclined angle of the entire one or more support portions with respect to a substrate placing portion, the one or more support portions being disposed at a portion of the substrate placing portion having a flat shape, the one or more support portions directly connected to the substrate placing portion, the substrate placing portion including an upper surface on which a substrate is placed that is brought into contact with a substrate, the one or more support portions being at least partially deformed by the contact with the substrate such that the one or more support portions move relative to the substrate placing portion; and specifying a degree of the deformation of the substrate based on the detection result of the detector.

14. A transfer device for transferring a substrate, comprising:

an end effector having a flat shape, the end effector including an upper surface on which a substrate is placed; and one or more support portions configured to support the substrate, directly connected to the upper surface of the end effector, and disposed at a portion of the end effector that is brought into contact with the substrate, at least one of the one or more support portions being at least partially deformed by the contact with the substrate such that the one or more support portions move relative to the end effector, and the deformation of the support portion including an amount of inclined angle of the entire support portion with respect to the upper surface of the end effector being detectable.

15. An end effector comprising:

an upper surface on which a substrate is placed; and one or more support portions configured to support the substrate, directly connected to the upper surface of the end effector, and disposed at a portion of the placing surface that is brought into contact with the substrate, at least one of the one or more support portion being at least partially deformed by the contact with the substrate such that the one or more support portions move relative to the end effector, and the deformation of the support portion including an amount of inclined angle of the entire support portion with respect to the upper surface of the end effector being detectable, wherein the end effector has a flat shape.

* * * * *